United States Patent [19]

Ueyama et al.

[11] Patent Number: 4,493,789
[45] Date of Patent: Jan. 15, 1985

[54] ELECTROCONDUCTIVE PASTE AND PROCESS FOR PRODUCING ELECTROCONDUCTIVE METALLIZED CERAMICS USING THE SAME

[75] Inventors: Tamotsu Ueyama; Takao Yamada, both of Katsuta, Japan

[73] Assignee: Hitachi Chemical Company, Ltd., Tokyo, Japan

[21] Appl. No.: 473,213

[22] Filed: Mar. 8, 1983

Related U.S. Application Data

[63] Continuation of Ser. No. 248,676, Mar. 30, 1981, abandoned.

[30] Foreign Application Priority Data

Mar. 31, 1980 [JP]  Japan .................................. 55-42391
Mar. 31, 1980 [JP]  Japan .................................. 55-42392

[51] Int. Cl.³ .............................................. H01B 1/06
[52] U.S. Cl. ...................................... 252/514; 252/512; 252/518; 252/521; 524/430; 524/433; 524/439
[58] Field of Search ............... 252/512, 514, 518, 521; 106/1.05, 1.15; 524/403, 439, 433, 440, 430; 523/457, 458

[56] References Cited

U.S. PATENT DOCUMENTS 3,830,651  8/1974  Minneman et al. ................. 106/1.15
4,039,721  8/1977  Wutge .................................. 252/514
4,187,486  2/1980  Hrosashi et al. ..................... 252/514
4,219,448  8/1980  Ross ..................................... 252/514

Primary Examiner—Josephine Barr
Attorney, Agent, or Firm—Antonelli, Terry & Wands

[57] ABSTRACT

A highly electroconductive paste for metallizing comprising (a) a high-melting metal powder such as W, Mo, Mo-Mn, Pt, etc., powder, (b) an additive such as MgO, CaO, $SiO_2$, $Al_2O_3$, etc., in an amount of 0.1 to 3 parts by weight per 100 parts by weight of the metal powder. (c) a binding agent, and (d) a solvent can give a highly electroconductive metallized ceramic having strongly bonded metallized layer by coating said paste on an alumina ceramic substrate and firing it.

25 Claims, No Drawings

ELECTROCONDUCTIVE PASTE AND PROCESS FOR PRODUCING ELECTROCONDUCTIVE METALLIZED CERAMICS USING THE SAME

This is a continuation of application Ser. No. 248,676, filed Mar. 30, 1981, abandoned.

This invention relates to a highly electroconductive paste for forming wiring conductor layers and a process for producing a highly electroconductive metallized ceramic by applying said electroconductive paste to sintered or unsintered alumina ceramic substrates.

Heretofore, in order to form conductor layers on the surfaces or interiors of alumina ceramic substrates which are used in ceramic wiring boards and packages, it has been necessary to print a conductive paste, for example, by a thick film forming method and to sinter it. In such a case, as a process for forming wiring conductor layers, there has been used, for example, a dry thick film wiring process in which a silver-palladium (Ag—Pd) series conductive paste mixed with glass frit as a binding agent is screen printed on a sintered alumina ceramic substrate and a conductor wiring layer is formed by melt binding the conductive paste at high temperatures. But the dry thick film wiring process has many disadvantages in that adhesive strength to the substrate is not so good because of melt binding by using a glass frit, wiring conductors are easily peeled off during the usage and some properties such as thermal shock properties are insufficient when said process is applied to high density wiring boards which require high adhesive strength, and said process is very expensive since noble metal conductors are used therein.

On the other hand, there have been proposed wiring conductor forming processes improving the disadavantages of the dry thick film wiring process. These processes are, for example, a molybdenum-manganese (Mo—Mn) metallizing process, a molybdenum (Mo) metallizing process, and a tungsten (W) metallizing process. The Mo—Mn metallizing process is applied to metal sealing of electron tubes and production of semiconductor products. But according to this process, since sintered substrates are used, it is necessary to conduct a sintering step two times or more in order to form conductor layers, which results in making the procedure complicated and costly. Further, it is difficult to apply this process to high density wiring boards, since dimensional accuracy is poor and reproducibility is low according to this process. In contrast, according to the Mo metallizing process and the W metallizing process, a metal paste such as a Mo paste or a W paste is screen printed on an unsintered alumina ceramic substrate by a thick film forming method, and the alumina ceramic substrate and the metal paste are fired simultaneously. According to these processes, there is a feature of obtaining strong adhesive strength which cannot be expected for the process of using sintered alumina ceramic substrates, since the alumina ceramic substrate and the metal paste readily diffuse mutually during the firing. But when these processes are applied, for example, to highly pure alumina ceramics having an alumina purity of 90% or higher generally used for high density wiring boards excellent in electrical properties, it is necessary to meet properly the sintering temperature of the alumina ceramics and the sintering temperature of the metal paste in order to complete the sintering of the alumina ceramics and to obtain strong adhesive strength between the substrate and the conductor layer, since the content of metal oxides which react with the metal paste and diffuse is small in the alumina ceramics. Therefore, as the metal paste, there has been used a paste obtained by mixing metal powders such as tungsten powders having relatively coarse particle size and readily meeting the sintering temperature of the alumina ceramics, a binding agent and a solvent. But electric resistance of the conductor layer of the wiring board produced by using such a paste is changed remarkably depending on the particle size of the metal powder such as tungsten and the sintering temperature. That is, according to the experiments carried out by the present inventors, electric resistance of the tungsten conductor layer formed on the alumina ceramic substrate and having good adhesive strength thereto was 0.03 mΩ cm when a paste containing tungsten particle size of 1 $\mu$m was used, said value being remarkably high compared with electric resistance value of metallic tungsten (0.0055 mΩ cm), and 0.05 mΩ cm when the tungsten particle size was 3.8 $\mu$m. Therefore, when said process is applied to multi-layer wiring boards having high wiring density or IC packages, there are many disadvantages in designing wiring in that distances between wiring should be made narrower, the number of layers should be increased for making multi-layer structure, and the like. On the other hand, when a tungsten paste obtained by using tungsten powders having a particle size of 0.5 $\mu$m or less is used in order to improve the above-mentioned disadvantages and to obtain high electroconductivity, the formation of wiring conductor layer becomes difficult, since proper meeting with the sintering temperature of the alumina ceramics can hardly be obtained, which results in remarkable decrease in metallizing strength, generation of cracks on or peeling of the metallized layer after sintering.

It is an object of this invention to provide a highly electroconductive metal paste for metallizing and also useful for the Mo metallizing process, the Mo—Mn metallizing process and the like as well as the W metallizing process and a process for producing said metal paste. It is another object of this invention to provide a process for producing highly electroconductive metallized ceramics having high adhesive strength by applying said metal paste for metallizing to sintered or unsintered alumina ceramic substrates.

This invention provides a highly electroconductive paste for metallizing comprising:
  (a) 100 parts by weight of high-melting point metal powder,
  0.1 to 3 parts by weight of an additive which can fill vacant spaces among particles of said metal powder and can shrink and condense said metal powder without proceeding sintering of said metal powder,
  (c) a binding agent, and
  (d) a solvent,
and a process for producing the same.

This invention also provides a process for producing a highly electroconductive metallized ceramic which comprises coating said metal paste for metallizing on an alumina ceramic substrate and firing said metal paste for form a metallized layer.

As the high-melting point metal powder, there can be used in this invention powders of W, Mo, Mo—Mn, Pt alone or a mixture thereof. In order to disperse the metal powders uniformly in the paste, those having a smaller particle size such as 0.3 to 8 $\mu$m are preferably used.

The additive should have such a function as filling vacant spaces among particles of said high-melting metal powder and shrink and condense said high-melting metal powder without proceeding sintering of said high-melting metal powder. Examples of the additive are so-called sintering promoters for alumina and alumina ceramics such as magnesium oxide, calcium oxide, silicon dioxide, aluminum oxide, or a mixture thereof. The additive is not particularly limited to those mentioned above and other compounds such as chromium oxide, titanium oxide, and the like can also be used so long as they can diffuse and penetrate among the high-melting metal particles at a temperature of the sintering temperature or lower of the alumina ceramics and can accelerate condensing or coalescing of these metal particles.

The additive such as sintering promoters for alumina and alumina ceramics is used in an amount of 0.1 to 3.0 parts by weight per 100 parts by weight of the high-melting metal powder. If the amount of the additive is outside the above-mentioned range, the object of this invention cannot be attained.

As the binding agent, there can be used cellulose derivative resins such as ethyl cellulose, nitrocellulose, etc., acrylic resins, alkyd and phenolic resins, vinyl resins, epoxy resins, and the like. The binding agent is usually used in an amount of 2 to 20 parts by weight per 100 parts by weight of the high-melting metal powder.

As the solvent for making a paste, there can be used aromatic solvents such as toluene, xylene, benzene, etc.; ester series solvents such as ethyl acetate, butyl acetate, butyric acid esters, propionic acid esters, etc.; ketone series solvents such as methyl ethyl ketone, cyclohexanone, etc.; alcohol series solvents such as ethyl alcohol, butyl alcohol, ethylene glycol monobutyl ether, ethylene glycol derivatives, and the like. These solvent should be able to dissolve the binding agent.

The solvent is used in an amount sufficient for uniformly dispersing and mixing the high-melting metal powder, the additive and the binding agent. Considering the removal of the solvent at the time of producing metallized ceramics, it is usually used in an amount of 5 to 100 parts by weight per 100 parts by weight of the high-melting metal powder.

The highly electroconductive metal paste for metallizing can be prepared by mixing the high-melting metal powder, the additive, the binding agent and the solvent by using a mixing and grinding machine. In addition, there can also be used a roll mill, a ball mill, an impeller mill, an oscillating mill, or the like depending on the viscosity of the metal paste.

Metallized ceramics are produced by coating the above-mentioned metal paste for metallizing on a substrate by a conventional process and firing the paste to form a metallized layer strongly binded to the substrate.

As the substrate, there can be used alumina ceramics, particularly preferably unsintered alumina ceramics. When very great adhesive strength is not necessary or the requirement for dimensional accuracy is not so strict, sintered alumina ceramic substrates usually used may be employed.

After coating the metal paste for metallizing on the alumina ceramic substrate by a conventional process such as a printing process (screen printing, offset printing, etc.), if necessary, the metal paste is dried at a temperature from room temperature to 160° C., and it is fired at a temperature of 1400° C. to 1700° C. It is preferable to carry out the firing under a weakly reducing atmosphere such as a mixture of an inert or reductive gas e.g., $H_2$ gas, $N_2$ gas, or the like and $H_2O$. But when an anti-oxidative metal paste such as a Pt paste is used, it can be fired under an oxidative atmosphere such as air. Firing time is usually from 30 minutes to 5 hours.

This invention is illustrated by way of the following Examples, in which all parts are parts by weight.

EXAMPLES

To tungsten powders having particle sizes as shown in Table 1 in an amount of 100 parts, additives having a composition containing sintering promoters for alumina and alumina ceramics as shown in Table 2 are added in amounts of 0, 0.3, 1, 3 and 5 parts. Further, 6 parts of ethyl cellulose, 2 parts of nitrocellulose, and a mixed solvent containing equal amounts of ethyl acetate and ethyl alcohol were mixed with the above-mentioned tungsten powders and additives in a mixing and grinding machine for 5 hours. After uniformly mixed, the solvent was replaced by ethylene glycol monobutyl ether to give a W paste. Then the W paste was screen printed on an unsintered alumina ceramic substrate having an Al purity of 96% and a thickness of 1.0 mm so as to make the film thickness 30 μm. After dried at 80° C. for 15 minutes, the W paste was fired at temperatures as lished in Table 1 under a weakly reductive atmosphere to form W metal conductor layers. Then the thickness, width and length of the W conductor layers on the alumina ceramic substrates were measured and volume resistivity was obtained by measuring electric resistance at 20° C. The results are as shown in Table 1.

TABLE 1

| Compounded composition | | | Firing Temperature (°C.) | | | | | |
|---|---|---|---|---|---|---|---|---|
| W powder | | | 1400 | | 1450 | | 1500 | |
| Particle size (μm) | (parts) | Additive (parts) | Adhesive strength (kg/mm$^2$) | Electric resistance (mΩ · cm) | Adhesive strength (kg/mm$^2$) | Electric resistance (mΩ · cm) | Adhesive strength (kg/mm$^2$) | Electric resistance (mΩ · cm) |
| 0.4 | 100 | 0 | 2.0–3.0 | 0.040 | 2.5–3.5 | 0.035 | 1.0–2.0 | 0.030 |
|  |  | 0.3 | " | 0.020 | " | 0.020 | " | 0.020 |
|  |  | 1.0 | " | " | " | " | " | " |
|  |  | 3.0 | " | " | " | " | " | " |
|  |  | 5.0 | " | 0.038 | " | 0.035 | " | 0.030 |
| 0.9 | 100 | 0 | 1.5–2.5 | 0.045 | 3.0–5.0 | 0.040 | 1.0–2.5 | 0.033 |
|  |  | 0.3 | " | 0.025 | " | 0.023 | " | 0.020 |
|  |  | 1.0 | " | " | " | " | " | " |
|  |  | 3.0 | " | " | " | " | " | " |
|  |  | 5.0 | " | 0.040 | " | 0.032 | " | 0.035 |
| 1.8 | 100 | 0 | 0.5–1.5 | 0.050 | 1.0–2.0 | 0.045 | 3.0–4.0 | 0.040 |
|  |  | 0.3 | " | 0.040 | " | 0.035 | " | 0.030 |
|  |  | 1.0 | " | " | " | " | " | " |

TABLE 1-continued

|  |  | Particle size (μm) | (parts) | Additive (parts) | Adhesive strength | Electric resistance | Adhesive strength | Electric resistance | Adhesive strength | Electric resistance |
| --- | --- | --- | --- | --- | --- | --- | --- | --- | --- | --- |
|  |  | 3.0 | " | " | " | " | " | " | " |
|  |  | 5.0 | " | " | 0.052 | " | 0.047 | " | 0.042 |
| 3.7 | 100 | 0 | 0–0.5 | 0.065 | 0–0.5 | 0.060 | 0.5–1.0 | 0.050 |
|  |  | 0.3 | " | 0.050 | " | 0.045 | " | 0.040 |
|  |  | 1.0 | " | 0.055 | " | " | " | 0.038 |
|  |  | 3.0 | " | 0.050 | " | " | " | 0.040 |
|  |  | 5.0 | " | 0.065 | " | 0.060 | " | 0.050 |

| Compounded composition | | | Firing Temperature (°C.) | | | |
| --- | --- | --- | --- | --- | --- | --- |
| W powder | | | 1550 | | 1600 | |
| Particle size (μm) | (parts) | Additive (parts) | Adhesive strength (kg/mm²) | Electric resistance (mΩ · cm) | Adhesive strength (kg/mm²) | Electric resistance (mΩ · cm) |
| 0.4 | 100 | 0 | 0.5–1.0 | 0.028 | 0–0.5 | 0.025 |
|  |  | 0.3 | " | 0.018 | " | 0.015 |
|  |  | 1.0 | " | " | " | " |
|  |  | 3.0 | " | " | " | " |
|  |  | 5.0 | " | 0.025 | " | 0.025 |
| 0.9 | 100 | 0 | 1.0 | 0.035 | 0–0.5 | 0.030 |
|  |  | 0.3 | " | 0.018 | " | 0.015 |
|  |  | 1.0 | " | " | " | " |
|  |  | 3.0 | " | " | " | " |
|  |  | 5.0 | " | 0.035 | " | 0.030 |
| 1.8 | 100 | 0 | 1.5–2.0 | 0.036 | 0–0.5 | 0.032 |
|  |  | 0.3 | " | 0.025 | " | 0.025 |
|  |  | 1.0 | " | " | " | " |
|  |  | 3.0 | " | " | " | " |
|  |  | 5.0 | " | 0.038 | " | 0.034 |
| 3.7 | 100 | 0 | 1.0–2.0 | 0.045 | 2.0–3.0 | 0.040 |
|  |  | 0.3 | " | 0.035 | " | 0.035 |
|  |  | 1.0 | " | " | " | 0.032 |
|  |  | 3.0 | " | " | " | 0.035 |
|  |  | 5.0 | " | 0.045 | " | 0.040 |

TABLE 2

| Components | Compounding Ratio (parts) | Mixing conditions |
| --- | --- | --- |
| $Al_2O_3$ | 5 | Dry mixed powders were heat treated at 1350° C. for 3 hours, ball-milled in water for 24 hours, dried at 100° C. for 24 hours, and further ground finely. |
| $SiO_2$ | 60 | |
| $MgO$ | 15 | |
| $CaCO_3$ | 20 | |

As shown in Table 1, electric resistance of the W layers is decreased in proportion to the firing temperatures and increased in proportion to the W particle sizes. On the other hand, as to the pastes obtained by adding sintering promoters to W powders, electric resistance is decreased with an increase of the addition amount of the sintering promoters to show a minimum value, and after which value, electric resistance is increased again with an increase of the addition amount of the sintering promoters.

Heretofore, it has been considered that when insulating particles are mixed with electroconductive particles, electroconductivity of the resulting mixture is lowered, so that a resistant paste containing carbon black or silver powder as a base is used practically. The phenomenon that the addition of a small amount of insulating particles comprising sintering promoters for alumina and alumina ceramics makes electroconductivity increase as mentioned in the above Examples cannot be expected from the common knowledge at all. The reason for this is not clear, but it seems that the additives such as sintering promoters for alumina and alumina ceramics fill vacant spaces among high-melting metal such as W powders and during the simultaneous sintering of the ceramics there is generated firing shrinkage, which causes shrinking and condensing of the whole high-melting metal powders to increase the packing density of W powders.

This invention is based on the finding of such an unexpected phenomenon. According to the common knowledge in this art, since electroconductivity of the W conductor layer is increased in proportion to the sintering temperature, it was necessary to use remarkably high sintering temperature in order to obtain a conductor layer having high electroconductivity, which resulted in over-sintering of alumina ceramics sometimes, decrease in mechanical strength and finally decrease in metallizing strength. Therefore, it was very difficult to obtain metallized wiring boards of high quality. But, such difficulty is overcome by this invention, wherein the additive such as one or more sintering promoters for alumina and alumina ceramics in an amount of 0.1 to 3 parts by weight is mixed with 100 parts by weight of high-melting metal powder. Since the specially mixed metal paste is used in this invention, even if the metal paste is fired at a temperature of 50° to 100° C. lower than the firing temperature of the conventional process, conductor layers having the same or higher electroconductivity compared with the conventional ones can be produced. Thus, it becomes possible to make wires finer without damaging conductor resistance. Consequently, this invention is practically excellent not only in improving packaging density of wiring boards and performance but also in economical and technical production of metallized ceramics.

What is claimed is:

1. A highly electroconductive paste for metallizing comprising:
   (a) 100 parts by weight of high-melting point metal powder selected from the group consisting of tungsten powder, molybdenum powder, molybdenum-manganese powder, platinum powder and mixtures thereof, (b) 0.1 to 3 parts by weight of an additive which is one or more sintering promoters for alumina and alumina ceramics selected from the group consisting of magnesium oxide, calcium oxide, silicon oxide, aluminum oxide and mixtures thereof, and which can fill vacant spaces among particles of said metal powder and can shrink and condense said metal powder without proceeding sintering of said metal powder, (c) a binding agent, and (d) a solvent.

2. A highly electroconductive paste according to claim 1, wherein the binding agent (c) is a cellulose derivative resin, an acrylic resin, an alkyd and phenolic resin, a vinyl resin, an epoxy resin, or a mixture thereof.

3. A highly electroconductive paste according to claim 1, wherein the solvent (d) is an aromatic hydrocarbon, an ester, a ketone, an alcohol or a mixture thereof.

4. A process for producing a highly electroconductive paste for metallizing which comprises:
dispersing uniformly,
(a) 100 parts by weight of high-melting point metal powder selected from the group consisting of tungsten powder, molybdenum powder, molybdenum-manganese powder, platinum powder and mixtures thereof, (b) 0.1 to 3 parts by weight of an additive which is one or more sintering promoters for alumina and alumina ceramics selected from the group consisting of magnesium oxide, calcium oxide, silicon oxide, aluminum oxide and mixtures thereof, which can fill vacant spaces among particles of said metal powder and can shrink and condense said metal powder without proceeding sintering of said metal powder, and (c) a binding agent in (d) a solvent by using a mixing means.

5. A process for producing a highly electroconductive metallized ceramic which comprises
coating on the surface of alumina ceramic substrate a highly electroconductive paste for metallizing comprising
(a) 100 parts by weight of high-melting point metal powder, (b) 0.1 to 3 parts by weight of an additive which can fill vacant spaces among particles of said metal powder and can shrink and condense said metal powder without proceeding sintering of said metal powder, (c) a binding agent, and (d) a solvent, and
firing said electroconductive paste to form a metallized layer.

6. A process according to claim 5, wherein the firing temperature is 1400° C. to 1700° C.

7. A process according to claim 5 or 6, wherein the alumina ceramic substrate is an unsintered alumina ceramic.

8. A process according to claim 5 or 6, wherein the firing is conducted under a weakly reductive atmosphere.

9. A process according to claim 5, wherein the high-melting point metal powder (a) is tungsten powder, molybdenum powder, molybdenum-manganese powder, platinum powder, or a mixture thereof.

10. A process according to claim 5, wherein the additive (b) is one or more sintering promoters for alumina and alumina ceramics.

11. A process according to claim 5, wherein the additive (b) is magnesium oxide, calcium oxide, silicon oxide, aluminum oxide or a mixture thereof.

12. A highly electroconductive paste according to claim 1, wherein the high-melting point powder is selected from the group consisting of tungsten powder, molybdenum powder, molybdenum-manganese powder and mixtures thereof.

13. A highly electroconductive paste according to claim 12, wherein the particle size of said metal powder is 0.3–8 μm.

14. A highly electroconductive paste according to claim 12, which consists essentially of said metal powder (a), said additive (b), said binding agent (c) and said solvent (d).

15. A highly electroconductive paste according to claim 12, wherein said metal powder (a) is tungsten powder.

16. A process according to claim 4, wherein the high-melting point metal powder is selected from the group consisting of tungsten powder, molybdenum powder, molybdenum-manganese powder and mixtures thereof.

17. A process according to claim 16, wherein said metal powder (a) is tungsten powder.

18. A highly electroconductive paste for metallizing comprising:
(a) 100 parts by weight of high-melting point metal powder selected from the group consisting of tungsten powder, molybdenum powder, molybdenum-manganese powder, and mixtures thereof, (b) 0.1 to 3 parts by weight of an additive which can fill vacant spaces among particles of said metal powder without proceeding sintering of said metal powder, (c) a binding agent, and (d) a solvent.

19. A highly electroconductive paste according to claim 18, wherein the high-melting point metal powder is tungsten powder.

20. A highly electroconductive paste according to claim 18, wherein the high-melting point metal powder is molybdenum powder.

21. A highly electroconductive paste according to claim 18, wherein the high-melting point metal powder is molybdenum-manganese powder.

22. A highly electroconductive paste according to claim 18, wherein the additive (b) is selected from the group consisting of chromium oxide and titanium oxide.

23. A process for producing a highly electroconductive paste for metallizing which comprises:
dispersing uniformly,
(a) 100 parts by weight of high-melting point metal powder selected from the group consisting of tungsten powder, molybdenum powder, molybdenum-manganese powder, and mixtures thereof, (b) 0.1 to 3 parts by weight of an additive which can fill vacant spaces among particles on said metal powder and can shrink and condense said metal powder without proceeding sintering of said metal powder, and (c) a binding agent in (d) a solvent by using a mixing means.

24. A process according to claim 6, wherein the alumina ceramic substrate is an unsintered alumina ceramic.

25. A process according to claim 6, wherein the firing is conducted under a weakly reductive atmosphere.

* * * * *